(12) United States Patent
Goya et al.

(10) Patent No.: US 10,442,032 B2
(45) Date of Patent: Oct. 15, 2019

(54) PROCESSING DEVICE AND PROCESSING METHOD

(71) Applicant: MITSUBISHI HEAVY INDUSTRIES, LTD., Tokyo (JP)

(72) Inventors: Saneyuki Goya, Tokyo (JP); Kenji Muta, Tokyo (JP); Toshiya Watanabe, Tokyo (JP); Takashi Ishide, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 585 days.

(21) Appl. No.: 15/300,207

(22) PCT Filed: Jan. 26, 2015

(86) PCT No.: PCT/JP2015/052073
§ 371 (c)(1),
(2) Date: Sep. 28, 2016

(87) PCT Pub. No.: WO2015/151562
PCT Pub. Date: Oct. 8, 2015

(65) Prior Publication Data
US 2017/0182590 A1    Jun. 29, 2017

(30) Foreign Application Priority Data

Mar. 31, 2014 (JP) ................... 2014-074055

(51) Int. Cl.
*B23K 26/062* (2014.01)
*B23K 26/082* (2014.01)
(Continued)

(52) U.S. Cl.
CPC ........ *B23K 26/062* (2015.10); *B23K 26/0622* (2015.10); *B23K 26/0624* (2015.10);
(Continued)

(58) Field of Classification Search
CPC .... B23K 26/062; B23K 26/082; B23K 26/21; B23K 26/32; B23K 26/142; B23K 26/38;
(Continued)

(56) References Cited

U.S. PATENT DOCUMENTS

| | | |
|---|---|---|
| 5,991,318 A | 11/1999 | Caprara et al. |
| 9,048,633 B2 | 6/2015 | Gronenborn et al. |

(Continued)

FOREIGN PATENT DOCUMENTS

| | | |
|---|---|---|
| JP | 5-329674 A | 12/1993 |
| JP | 6-142961 A | 5/1994 |

(Continued)

OTHER PUBLICATIONS

Korean Office Action dated Feb. 22, 2018 in corresponding Korean Patent Application No. 10-2016-7003704 with an English Translation.

(Continued)

*Primary Examiner* — Samuel M Heinrich
(74) *Attorney, Agent, or Firm* — Birch, Stewart, Kolasch & Birch, LLP

(57) ABSTRACT

Provided are a processing device and a processing method with which the device can be made more compact, and with which highly precise processing can be performed. The processing device, which processes a member to be processed by irradiating the member to be processed with a laser, has: a laser oscillator having a plurality of vertical cavity surface-emitting laser diode chips that output laser light having a wavelength of 1,070 nm or less, and a substrate on the surface of which the plurality of vertical cavity surface-emitting laser diode chips are arranged in a matrix; a guidance optical system that guides the laser light output from the laser oscillator; and a control device that controls the output of the laser oscillator.

20 Claims, 16 Drawing Sheets

(51) Int. Cl.
  *B23K 26/21*    (2014.01)
  *B23K 26/32*    (2014.01)
  *B23K 26/342*   (2014.01)
  *H01S 5/042*    (2006.01)
  *B23K 26/40*    (2014.01)
  *H01S 5/024*    (2006.01)
  *H01S 5/42*     (2006.01)
  *H01S 5/00*     (2006.01)
  *H01S 5/40*     (2006.01)
  *B23K 26/0622*  (2014.01)
  *B23K 26/38*    (2014.01)
  *B23K 26/08*    (2014.01)
  *B23K 26/34*    (2014.01)
  *B23K 103/04*   (2006.01)

(52) U.S. Cl.
  CPC ........ *B23K 26/082* (2015.10); *B23K 26/0884* (2013.01); *B23K 26/21* (2015.10); *B23K 26/32* (2013.01); *B23K 26/34* (2013.01); *B23K 26/342* (2015.10); *B23K 26/38* (2013.01); *B23K 26/40* (2013.01); *H01S 5/0071* (2013.01); *H01S 5/02423* (2013.01); *H01S 5/02476* (2013.01); *H01S 5/042* (2013.01); *H01S 5/4012* (2013.01); *H01S 5/423* (2013.01); *B23K 2103/05* (2018.08)

(58) Field of Classification Search
  CPC ... B23K 26/40; H01S 5/02; H01S 5/42; H01S 5/00; H01S 5/40; H01S 5/04
  USPC .............. 219/121.6, 121.61–121.72, 121.85
  See application file for complete search history.

(56) References Cited

U.S. PATENT DOCUMENTS

| | | | |
|---|---|---|---|
| 9,757,817 B2 * | 9/2017 | Webster | ............... B23K 26/032 |
| 2008/0253410 A1 | 10/2008 | Sakurai et al. | |
| 2013/0215914 A1 | 8/2013 | Imai et al. | |
| 2013/0216246 A1 | 8/2013 | Hoshi et al. | |
| 2013/0269354 A1 | 10/2013 | Starkweather et al. | |
| 2017/0120337 A1 * | 5/2017 | Kanko | .................. B22F 3/1055 |

FOREIGN PATENT DOCUMENTS

| | | | |
|---|---|---|---|
| JP | 8-97505 A | 4/1996 |
| JP | 2831215 B2 | 12/1998 |
| JP | 2002-26452 A | 1/2002 |
| JP | 2002-540590 A | 11/2002 |
| JP | 2006-305620 A | 11/2006 |
| JP | 2008-260054 A | 10/2008 |
| JP | 2009-94308 A | 4/2009 |
| JP | 2012-4227 A | 1/2012 |
| JP | 2013-504457 A | 2/2013 |
| JP | 2013-171892 A | 9/2013 |
| KP | 10-2012-0053045 A | 5/2012 |
| WO | WO 2011/033418 A1 | 3/2011 |
| WO | WO 2012/053045 A1 | 4/2012 |

OTHER PUBLICATIONS

English translation of the Written Opinion of the International Searching Authority (Form PCT/ISA/237) dated Apr. 28, 2015, for International Application No. PCT/JP2015/052073.

International Search Report for PCT/JP2015/052073 (PCT/ISA/210) dated Apr. 28, 2015.

Written Opinion of the International Searching Authority for PCT/JP2015/052073 (PCT/ISA/237) dated Apr. 28, 2015.

Office Action dated Mar. 14, 2018 issued in corresponding Korean Patent Application No. 10-2016-7028273 with an English Translation.

* cited by examiner

PROCESSING DEVICE AND PROCESSING METHOD

TECHNICAL FIELD

The present invention relates to a processing device and a processing method for processing a member to be processed.

BACKGROUND ART

A processing device that uses a laser can be given as an example of a processing device that carries out processing such as cutting, boring holes, surface treatment, cladding, or welding on a member to be processed. The processing devices disclosed in Patent Documents 1 and 2 perform cutting, boring, or the like of a member to be processed by irradiating the member to be processed with a laser. For example, Patent Document 1, which was filed by the applicant of the present application, discloses a processing device including a $CO_2$ laser oscillator and an excimer laser oscillator. The processing device uses two lasers, namely a $CO_2$ laser beam and an excimer laser beam, and cuts or bores holes in a plastic member or an FRP material by irradiating the member with the $CO_2$ laser beam. The processing device then removes a carbonized layer or a heat-affected layer produced on the cutting surface by irradiating the cutting surface and an adjacent region thereof with the excimer laser beam.

Additionally, a vertical cavity surface-emitting laser (VCSEL) that outputs a beam in a vertical direction relative to a substrate surface has been proposed as a laser oscillator (see Patent Documents 2 and 3).

CITATION LIST

Patent Documents

Patent Document 1: Japanese Patent No. 2831215
Patent Document 2: Japanese Unexamined Patent Application Publication No. 2013-504457A
Patent Document 3: Japanese Unexamined Patent Application Publication No. 2002-26452A

SUMMARY OF INVENTION

Technical Problem

Using a $CO_2$ laser beam and an excimer laser beam, as in Patent Document 1, increases the size of the device that outputs the laser and limits the improving of the usage efficiency of the laser. Meanwhile, although the semiconductor laser vertical cavity surface-emitting lasers disclosed in Patent Documents 2 and 3 can reduce the size of the device, there is still room for improvement in this respect.

Having been conceived in light of the foregoing, an object of the present invention is to provide a processing device and a processing method that can make the device smaller and carry out processing at a high level of precision.

Solution to Problem

To solve the above-described problem and achieve the object, a processing device according to the present invention is a processing device that processes a member to be processed by irradiating the member to be processed with a laser, the device including: a laser oscillator including a plurality of vertical cavity surface-emitting laser diode chips that output a laser having a wavelength of no greater than 1,070 nm, and a substrate on the surface of which the plurality of vertical cavity surface-emitting laser diode chips are arranged in a matrix; a guidance optical system that guides the laser outputted from the laser oscillator; and a control device that controls the output of the laser oscillator.

Preferably, the processing device includes a plurality of the laser oscillators, and the plurality of laser oscillators are arranged so that laser output surfaces thereof are adjacent to each other.

Preferably, the plurality of laser oscillators are arranged in a matrix.

Preferably, the plurality of laser oscillators are arranged in a single row.

To solve the above-described problem and achieve the object, a processing device according to the present invention is a processing device that processes a member to be processed, the device including: a processing head that processes the member to be processed; a heating head that heats the member to be processed, the heating head including a laser oscillator, which has a plurality of vertical cavity surface-emitting laser diode chips that output a laser and a substrate on the surface of which the plurality of vertical cavity surface-emitting laser diode chips are arranged in a matrix, and a guidance optical system that guides the laser outputted from the laser oscillator; and a control device that controls the heating of the member to be processed by controlling the output of the laser oscillator.

Preferably, the processing head processes the member to be processed by irradiating the member to be processed with a laser.

Preferably, the heating head is fixed to the processing head.

Preferably, the guidance optical system focuses the laser outputted from the plurality of vertical cavity surface-emitting laser diode chips onto the member to be processed.

Preferably, the guidance optical system includes a focusing unit that focuses the laser outputted from the plurality of vertical cavity surface-emitting laser diode chips, and an optical fiber cable on which the laser focused by the focusing unit is incident and that transmits the laser.

Preferably, the laser oscillator includes a cooling mechanism that cools the substrate.

Preferably, the control device controls a laser power distribution of the vertical cavity surface-emitting laser diode chips of the laser oscillator.

Preferably, the processing is one of three-dimensional printing, cladding, welding, surface treatment, boring a hole, cutting, and engraving.

To solve the above-described problem and achieve the object, a processing method according to the present invention is a processing method for processing a member to be processed by irradiating the member to be processed with a laser, the method including: outputting a laser having a wavelength of no greater than 1,070 nm from a plurality of vertical cavity surface-emitting laser diode chips arranged in a matrix on a surface; and processing the member to be processed by guiding the outputted laser using a guidance optical system.

To solve the above-described problem and achieve the object, a processing method according to the present invention is a processing method for processing a member to be processed by irradiating the member to be processed with a laser, the method including: heating the member to be processed by outputting a laser from a plurality of vertical cavity surface-emitting laser diode chips arranged in a matrix on a surface and guiding the outputted laser using a guidance optical system; and processing the member to be processed using a processing head.

Advantageous Effects of Invention

The present invention has an effect of making it possible to make the device smaller and carry out processing at a high level of precision.

DESCRIPTION OF EMBODIMENTS

Detailed descriptions of embodiments of a processing device and a processing method according to the present invention will be given below on the basis of the drawings. Note that the present invention is not limited by these embodiments. For example, although the present embodiment describes a case of processing a plate-shaped member to be processed, the shape of the member to be processed is not particularly limited. The member to be processed can have a variety of shapes. Additionally, the processing device according to the present embodiment can carry out a process for forming holes in the member to be processed, a process for cutting the member to be processed in a straight line, and so on. The processing device can also form shapes aside from holes and straight lines, such as shapes having bend points and curved shapes, by adjusting a processing location on the member to be processed, or in other words, by adjusting a location irradiated by a laser. Furthermore, the processing carried out by the processing device is not limited to cutting or boring holes. The processing device can also be used in processing such as three-dimensional printing, cladding, welding, surface treatment, engraving, and the like. The surface treatment includes quench hardening, heating (for example, annealing for the purpose of eliminating residual stress, crystal growth of metals or semiconductors, and so on), polishing, surface cleaning, coating film removal, and the like. Furthermore, in the present embodiment, a laser and a member to be processed are moved relative to each other by moving the member to be processed. However, the laser may be moved instead, or both the laser and the member to be processed may be moved.

First Embodiment

Figure 1:
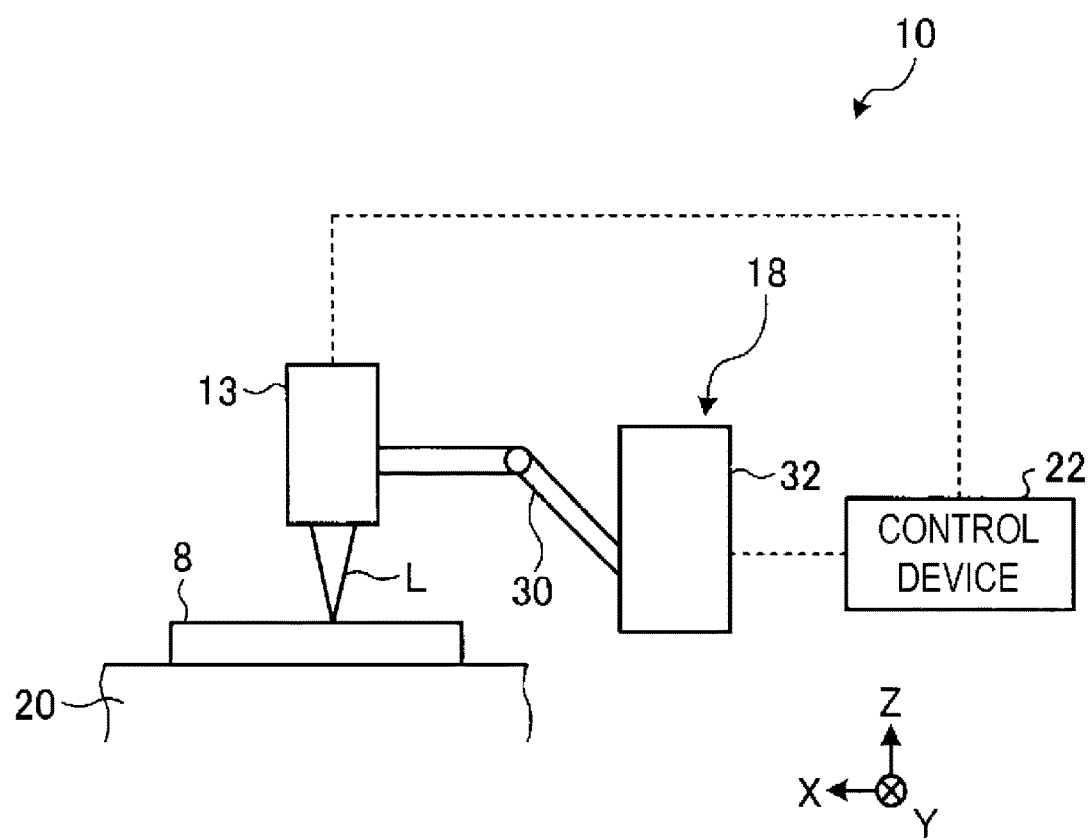
FIG. 1 is a schematic view illustrating a schematic configuration of a first embodiment of a processing device.
Figure 2:
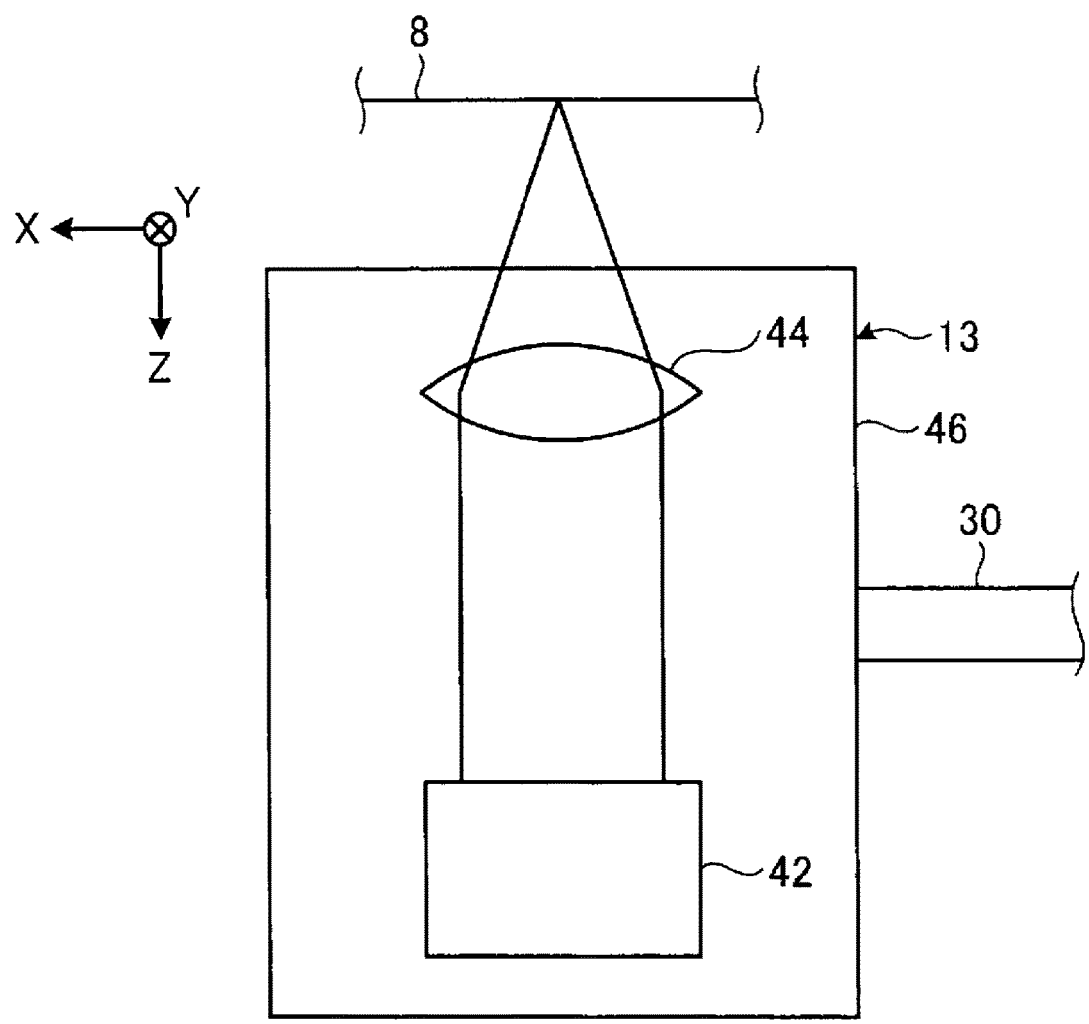
FIG. 2 is a schematic view illustrating a schematic configuration of a processing head illustrated in FIG. 1.
Figure 3:
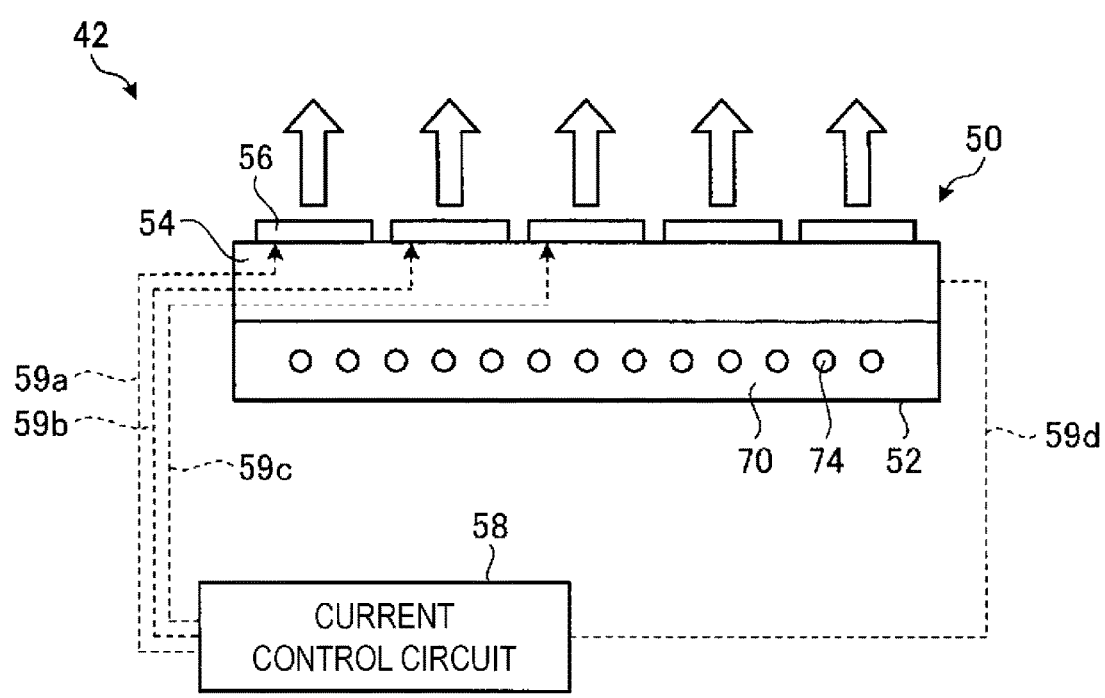
FIG. 3 is a schematic view illustrating a schematic configuration of a laser oscillator.
Figure 4:
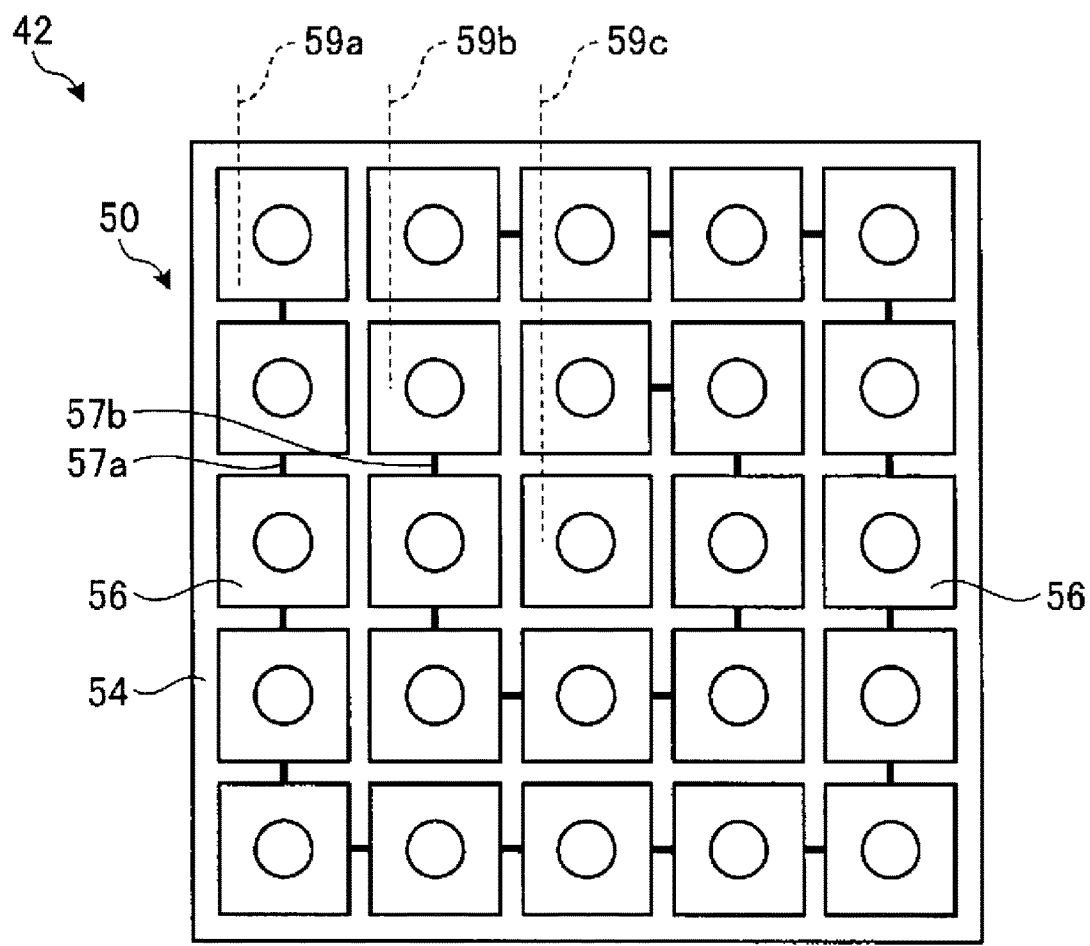
FIG. 4 is a schematic view illustrating a schematic configuration of a laser diode chip in the laser oscillator.
Figure 5:
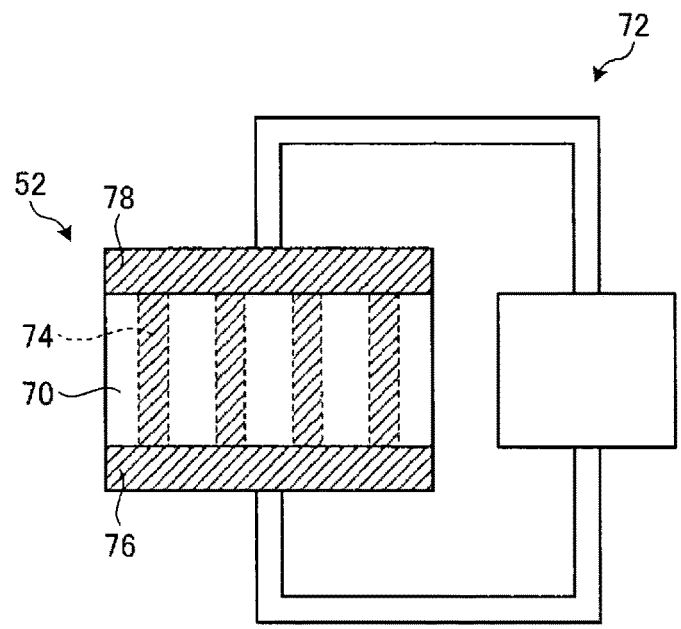
FIG. 5 is a schematic view illustrating a schematic configuration of a cooling mechanism in the laser oscillator.

FIG. 1 is a schematic view illustrating a schematic configuration of a first embodiment of a processing device. FIG. 2 is a schematic view illustrating a schematic configuration of a processing head illustrated in FIG. 1. FIG. 3 is a schematic view illustrating a schematic configuration of a laser oscillator. FIG. 4 is a schematic view illustrating a schematic configuration of a laser diode chip in the laser oscillator. FIG. 5 is a schematic view illustrating a schematic configuration of a cooling mechanism in the laser oscillator. As illustrated in FIG. 1, a processing device 10 includes a processing head 13, a movement mechanism 18, a support 20, and a control device 22. The processing device 10 processes a member to be processed 8 by irradiating the member to be processed 8, which is placed on the support 20, with a laser. In the present application, the processing device 10 takes a surface of the member to be processed 8 as an XY plane and takes a direction orthogonal to the surface of the member to be processed 8 as a Z direction.

The member to be processed 8 according to the present embodiment is a planar member. Members created from a variety of materials, such as Inconel (registered trademark), Hastelloy (registered trademark), stainless steel, a ceramic material, steel, carbon steel, ceramics, silicon, titanium, tungsten, a resin, plastics, glass, a member to which a coating has been applied, and so on, can be used as the member to be processed 8. Members created from a fiber-reinforced plastic such as CFRP (carbon fiber reinforced plastic), GFRP (glass fiber reinforced plastic), or GMT (glass long-fiber reinforced plastic), various types of metals such as an iron alloy aside from a steel plate, an aluminum alloy, or the like, other types of composite materials, and so on can also be used as the member to be processed 8.

The processing head 13 processes the member to be processed 8 by irradiating the member to be processed 8 with a laser (a laser beam). As illustrated in FIG. 2, the processing head 13 includes a laser oscillator 42, a guidance optical system 44, and a housing 46.

As illustrated in FIG. 3, the laser oscillator 42 includes a laser output section 50 and a cooling mechanism 52 that cools the laser output section 50. The laser output section 50 includes a substrate 54, a plurality of VCSEL chips (vertical cavity surface-emitting laser elements) 56 disposed on the substrate 54, and a current control circuit 58.

The substrate 54 is a planar member in which wires 57*a* and 57*b* are provided. Wires 59*a*, 59*b*, 59*c*, and 59*d* are also provided in the substrate 54. The wires 59*a*, 59*b*, 59*c*, and 59*d* in the substrate 54 are connected to the current control circuit 58.

The plurality of VCSEL chips 56 are vertical cavity surface-emitting laser (VCSEL) elements that output beams in the vertical direction relative to a surface of the substrate. As illustrated in FIG. 4, the VCSEL chips 56 are disposed in matrix form. Additionally, by being disposed on the surface of the planar substrate 54, the VCSEL chips 56 are arranged in parallel in a single plane.

The laser output section 50 illustrated in FIG. 4 has 25 VCSEL chips 56 arranged in five rows by five columns. In the laser output section 50, the 16 VCSEL chips 56 arranged in the outer periphery are connected serially by the wire 57*a* and are connected to the current control circuit 58 by the wire 59*a*. Meanwhile, the eight VCSEL chips 56 arranged one step in from the outer periphery are connected serially by the wire 57*b* and are connected to the current control circuit 58 by the wire 59*b*. In the laser output section 50, the one VCSEL chip 56 in the center is connected to the current control circuit 58 by the wire 59*c*. Additionally, in the laser output section 50, common electrodes of the VCSEL chips 56 are connected by the wire 59*d*.

The current control circuit 58 controls driving of the VCSEL chips 56 by supplying currents to the VCSEL chips 56 over the wires 59*a*, 59*b*, 59*c*, and 59*d*. The current control circuit 58 connects the VCSEL chips 56 using three types of wires, and controls the VCSEL chips 56 connected by the respective wires in tandem with each other.

The laser output section 50 causes the VCSEL chips 56 to output lasers by supplying currents to the VCSEL chips 56 from the current control circuit 58.

Although FIG. 4 illustrates a case where the laser output section 50 has 25 VCSEL chips 56 arranged in five rows by five columns, the laser output section 50 is not limited thereto. There may be more or less than 25 VCSEL chips 56 provided. Additionally, although the shape in which the elements are arranged is preferably a quadrangle as in the present embodiment or a circle, any desired shape can be used.

The cooling mechanism 52 includes a copper plate 70 and a cooling fluid supply mechanism 72 that circulates cooling fluid with the copper plate 70. The copper plate 70 makes contact with the surface of the substrate 54 in the laser output section 50 opposite from the surface on which the VCSEL chips 56 are disposed. A plurality of cooling fluid flow paths 74 are formed in parallel in the copper plate 70, with a header 76 connected to one end of each flow path and a header 78 connected to another end of each flow path. The cooling fluid supply mechanism 72 is connected to the header 76 and the header 78, and supplies the cooling fluid to the header 76 and collects the cooling fluid from the header 78. The cooling fluid supply mechanism 72 includes a pump, piping, and a cooling unit that cools the cooling fluid. The piping is connected to the header 76 and the header 78, and the pump and the cooling unit are connected to the piping, thus forming a single closed flow channel among the copper plate 70, the pump, and the cooling unit. Note that rather than being a closed flow channel, the cooling fluid supply mechanism 72 may discard the used cooling fluid.

The cooling mechanism 52 cools the copper plate 70, which results in cooling the substrate 54 and the laser output section 50, by the cooling fluid supply mechanism 72 to supply the cooling fluid to the header 76, the cooling fluid flow paths 74, and the header 78 in that order.

The guidance optical system 44 is an optical system that guides the laser outputted from the laser oscillator 42 to the member to be processed 8. The guidance optical system 44 includes a lens, which focuses the laser outputted from the laser oscillator 42 onto the member to be processed 8. The guidance optical system 44 may employ a combination of mirrors, lenses, and the like. The processing head 13 irradiates the member to be processed 8 with a laser L outputted from the laser oscillator 42 and guided by the guidance optical system 44. The housing 46 holds the laser oscillator 42 and the guidance optical system 44.

The movement mechanism 18 includes an arm 30 and a driving source 32 that moves the arm 30. The arm 30 supports the housing 46 of the processing head 13 on a tip end of the arm 30. The driving source 32 is capable of moving the arm 30 in three axial directions, namely X, Y, and Z, as well as rotating in a θ direction. The movement mechanism 18 can irradiate various locations of the member to be processed 8 with the laser L by the driving source 32 moving the arm 30 in the X, Y, and Z direction and rotating in the θ direction. Although the present embodiment describes a mechanism that moves the processing head 13 using the arm 30 and the driving source 32 as the movement mechanism 18, a mechanism that moves the processing head 13 using an XY stage, an XYZ stage, or the like can be employed as well.

The support 20 supports the member to be processed 8 in a predetermined position. Note that the processing device 10 may employ an XY stage that moves the support 20 and the member to be processed 8 in the X and Y directions. The control device 22 controls the operations of the various units.

The control device 22 adjusts various conditions of the laser outputted from the laser oscillator 42, adjusts the position of the processing head 13 relative to the member to be processed 8 by the movement mechanism 18 to move the processing head 13. The processing device 10 is configured as described above.

The processing device 10 causes the laser L to be outputted from the VCSEL chips 56 of the laser oscillator 42. The processing device 10 processes the member to be processed 8 by guiding the outputted laser L to the member to be processed 8 using the guidance optical system 44 and irradiating the member to be processed 8 with the laser L.

According to the processing device 10, the device can be made smaller by using the VCSEL chips 56 in the laser oscillator 42 that outputs the laser. Additionally, the cooling mechanism 52 can suppress a rise in temperature of the laser output section 50 by cooling the laser output section 50, which makes it possible for the processing device 10 to operate stably for long periods of time. The intensity of the outputted laser can also be adjusted by adjusting the number of the VCSEL chips 56 provided. Furthermore, a highly-directional laser can be outputted from the laser oscillator 42, which can control the laser using a simple optical system.

Here, in the processing device 10, the wavelength of the laser outputted from the VCSEL chips 56 is preferably no greater than 1,070 nm. Thus, the member to be processed 8 can be processed suitably. Additionally, the output of a single VCSEL chip 56 is preferably no less than 1 mW and no greater than 10 mW. Additionally, the output of the laser oscillator 42 is preferably no less than 10 W and no greater than 10 kW. The output of the laser oscillator 42 is further preferably no less than 100 W and no greater than 10 kW, and the output is still further preferably no less than 500 W and no greater than 10 kW. Setting the output of a single VCSEL chip 56 to no less than 1 mW and setting the output of the laser oscillator 42 to no less than 10 W can increase the individual outputs and reduce the number of elements necessary to obtain the required output. The number of elements necessary to obtain the required output can be further reduced by setting the outputs to the above-described further preferable ranges. Meanwhile, setting the output of the laser oscillator 42 to no greater than 10 kW can reduce the size of the device. Specifically, the amount of heat emitted from the laser oscillator 42 can be reduced, which can reduce the size of the cooling mechanism 52. This can result in suppressing an increase in the size of the device as a whole. Additionally, an increase in the size of the device can be suppressed by employing the above-described further preferable ranges.

Additionally, according to the processing device 10, using the VCSEL chips 56 for the laser oscillator 42 that outputs the laser can adjust the intensity of the laser outputted by each VCSEL chip 56, which can result in shaping the profile of the laser L as desired. Specifically, the processing device 10 can control the intensity of the laser outputted from each VCSEL chip 56 by the control device 22 to control the currents supplied from the current control circuit 58 to the VCSEL chips 56, which can shape the profile of the laser L as desired.

Figure 6:
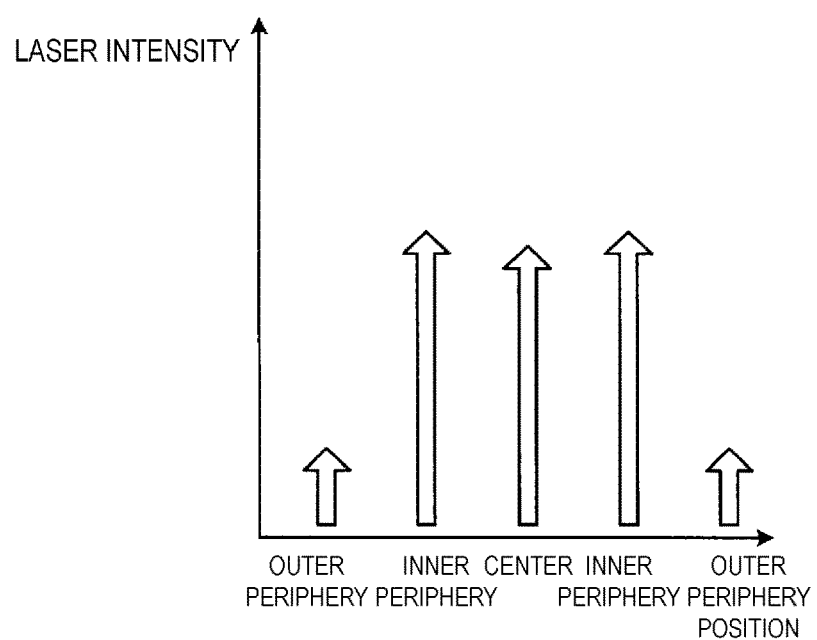
FIG. 6 is a graph illustrating an example of a laser power distribution of the laser oscillator.
Figure 7:
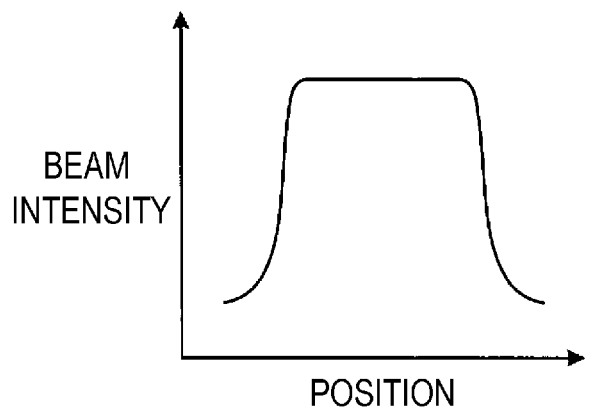
FIG. 7 is a graph illustrating an example of a laser power distribution of the laser oscillator.
Figure 8:
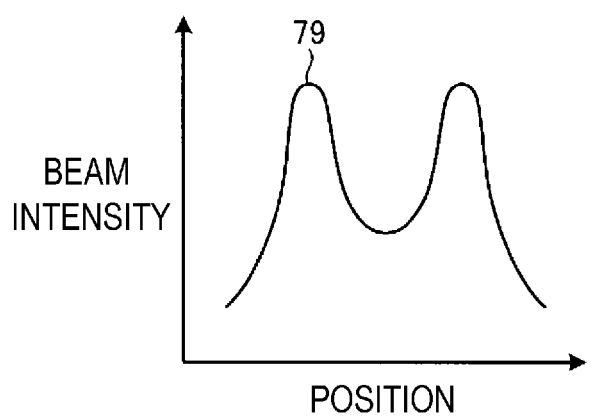
FIG. 8 is a graph illustrating an example of a laser power distribution of the laser oscillator.
Figure 9:
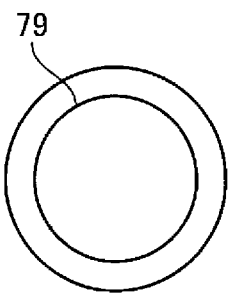
FIG. 9 is an explanatory diagram illustrating an example of a laser power distribution of the laser oscillator.

FIG. 6 is a graph illustrating an example of a laser power distribution of the laser oscillator. FIG. 7 is a graph illustrating an example of a laser power distribution of the laser oscillator. FIG. 8 is a graph illustrating an example of a laser power distribution of the laser oscillator. FIG. 9 is an explanatory diagram illustrating an example of a laser power distribution of the laser oscillator. For example, the processing device 10 can realize a flat-top-shaped laser power distribution, such as that illustrated in FIG. 7, by setting the outputs of the VCSEL chips 56 in the center and on an inner peripheral side to be the same and reducing the outputs of the VCSEL chips 56 on an outer peripheral side, as illustrated in FIG. 6. As a result, a flat-top-shaped laser power distribution can be formed without using optical elements such as DOEs or the like. Meanwhile, by reducing the outputs of the VCSEL chips 56 in the center and the outer peripheral side and increasing the outputs of the VCSEL chips 56 on the inner peripheral side between the center and the outer periphery, the processing device 10 can realize a ring-shaped laser power distribution such as that illustrated in FIGS. 8 and 9, where output peaks 79 form a ring in a position distanced from the center. As a result, light can be outputted with a ring-shaped laser power distribution without using an optical system such as that disclosed in Japanese Unexamined Patent Application Publication No. 2012-230366A. Additionally, the processing device 10 can also output light with a laser power distribution of the Gaussian type by reducing the output as the elements progress from the center toward the outer peripheral side.

As such, the control of the laser power distribution in the processing device 10 is simpler than in the case where light is outputted from a single light-emitting element, and a laser having a desired laser power distribution can be outputted. Additionally, although the VCSEL chips 56 are grouped in order from the center outward and connected by wires in the present embodiment, a variety of patterns can be used as patterns for connecting the VCSEL chips.

Additionally, the cooling mechanism 52 of the processing device 10 is not limited to the above-described example, and a variety of mechanisms can be used. Other examples of the cooling mechanism will be described using FIGS. 10 to 18. Note that the cooling mechanism can combine a variety of features as well.

Figure 10:
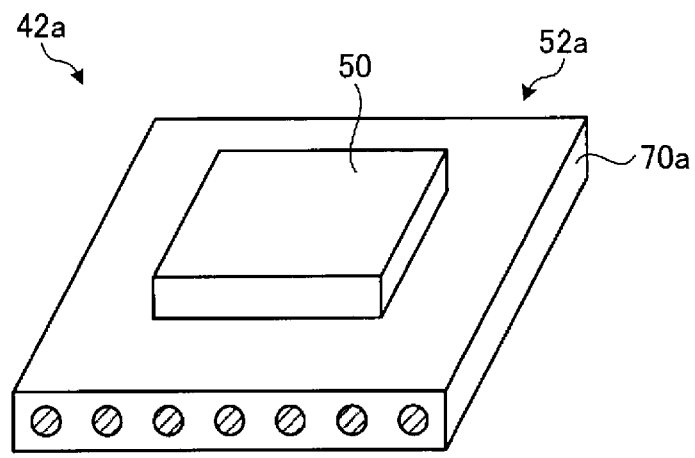
FIG. 10 is a perspective view illustrating a schematic configuration of a first variation on the cooling mechanism in the laser oscillator.

FIG. 10 is a perspective view illustrating a schematic configuration of a first variation on the cooling mechanism in the laser oscillator. According to a cooling mechanism 52a of a laser oscillator 42a illustrated in FIG. 10, a copper plate 70a is larger than the laser output section 50. Enlarging the copper plate 70a in this manner can improve the capability of cooling the laser output section 50.

Figure 11:
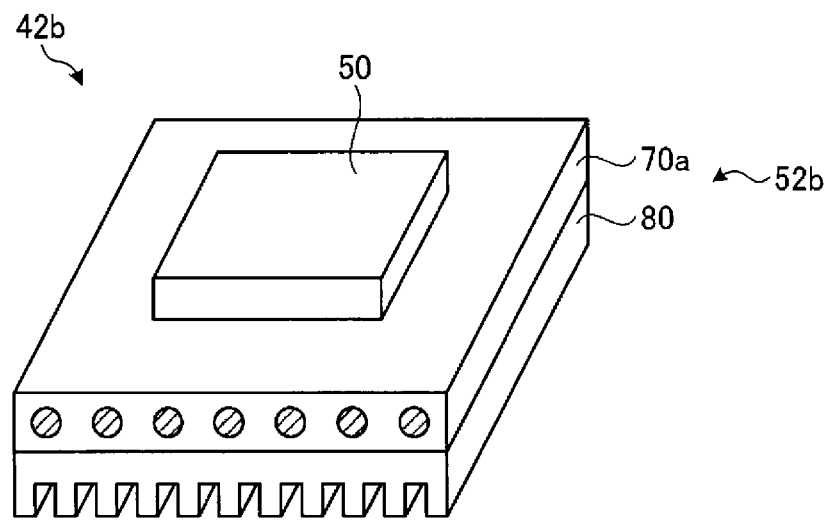
FIG. 11 is a perspective view illustrating a schematic configuration of a second variation on the cooling mechanism in the laser oscillator.
Figure 12:
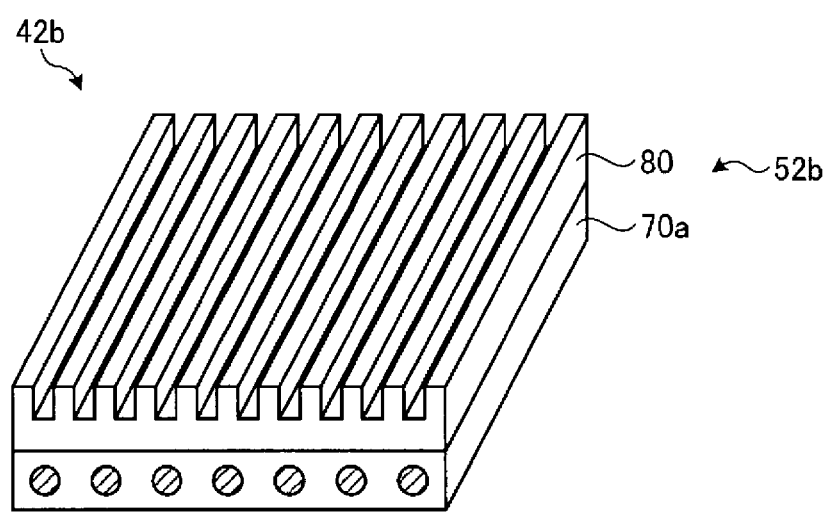
FIG. 12 is a perspective view illustrating the laser oscillator illustrated in FIG. 11 from the opposite side.

FIG. 11 is a perspective view illustrating a schematic configuration of a second variation on the cooling mechanism in the laser oscillator. FIG. 12 is a perspective view illustrating the laser oscillator illustrated in FIG. 11 from the opposite side. According to a cooling mechanism 52b of a laser oscillator 42b illustrated in FIGS. 11 and 12, a heat sink 80 is provided on the surface of the laser output section 50 opposite from the copper plate 70a. The heat sink 80 is an air cooling mechanism in which recesses and projections are formed, which increases the surface area that makes contact with air. According to the cooling mechanism 52b, providing the heat sink 80 can further improve the cooling capability.

Figure 13:
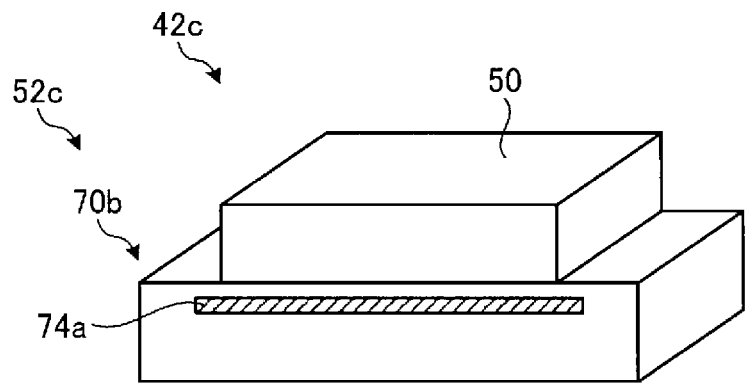
FIG. 13 is a perspective view illustrating a schematic configuration of a third variation on the cooling mechanism in the laser oscillator.
Figure 14:
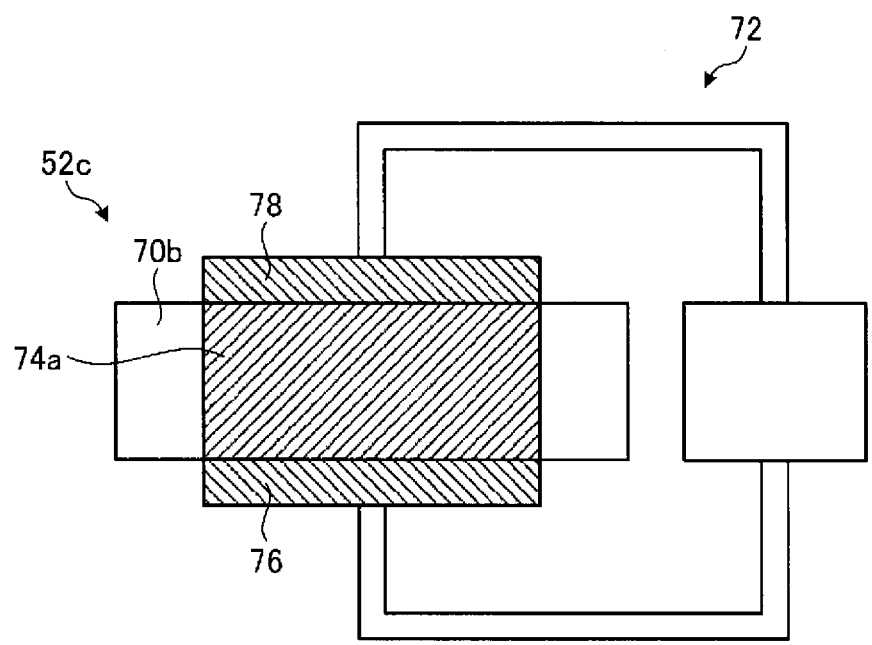
FIG. 14 is a schematic view illustrating the schematic configuration of the cooling mechanism in the laser oscillator illustrated in FIG. 13.

FIG. 13 is a perspective view illustrating a schematic configuration of a third variation on the cooling mechanism in the laser oscillator. FIG. 14 is a schematic view illustrating the schematic configuration of the cooling mechanism in the laser oscillator illustrated in FIG. 13. According to a cooling mechanism 52c of a laser oscillator 42c illustrated in FIGS. 13 and 14, a cooling fluid flow path 74a in a copper plate 70b has a quadrangular cross-sectional shape, and is a single flow channel formed overlapping the entire surface of the laser output section 50. This can increase the surface area of the part that overlaps with the laser output section 50, which can result in improving the cooling performance. Additionally, the cooling fluid flow path 74a is shorter in the direction orthogonal to a contact surface between the copper plate 70b and the laser output section 50 than in other directions, which can increase the flow rate of the supplied cooling fluid while ensuring a surface area that contributes to the cooling.

Figure 15:
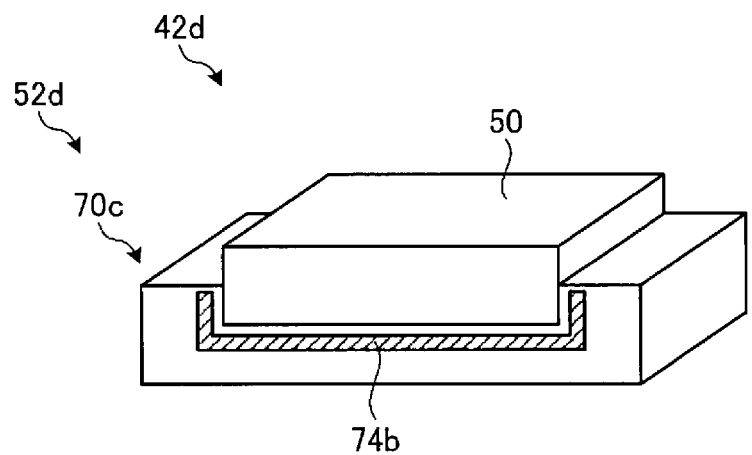
FIG. 15 is a perspective view illustrating a schematic configuration of a fourth variation on the cooling mechanism in the laser oscillator.

FIG. 15 is a perspective view illustrating a schematic configuration of a fourth variation on the cooling mechanism in the laser oscillator. According to a cooling mechanism 52d of a laser oscillator 42d illustrated in FIG. 15, a copper plate 70c also makes contact with side surfaces of the laser output section 50. In other words, a recess is formed in the copper plate 70c, and the laser output section 50 is disposed within the recess. A cooling fluid flow path 74b is also formed in parts of the copper plate 70c corresponding to the side surfaces, and thus has a U-shaped cross-section. The cooling fluid flow path 74b is a single flow channel formed corresponding to the laser output section 50. This can increase the surface area of the part that overlaps with the laser output section 50, which can result in improving the cooling performance.

Figure 16:
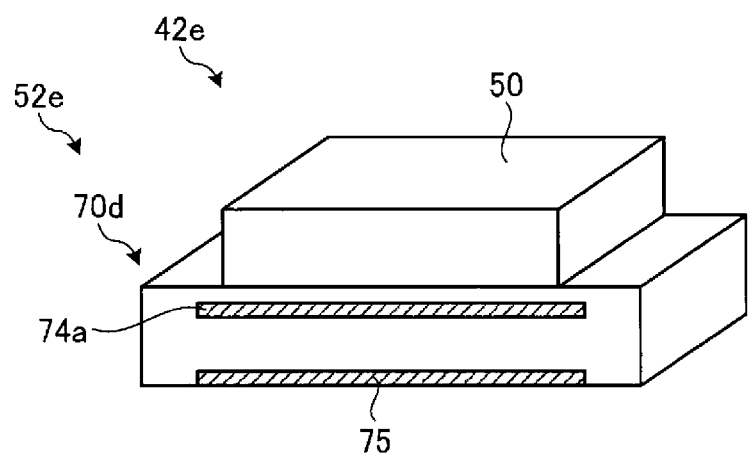
FIG. 16 is a perspective view illustrating a schematic configuration of a fifth variation on the cooling mechanism in the laser oscillator.

FIG. 16 is a perspective view illustrating a schematic configuration of a fifth variation on the cooling mechanism in the laser oscillator. According to a cooling mechanism 52e of a laser oscillator 42e illustrated in FIG. 16, two cooling fluid flow paths, namely the cooling fluid flow path 74a and a cooling fluid flow path 75, are formed in a copper plate 70d. The cooling fluid flow path 75 is formed parallel to the cooling fluid flow path 74a, in a location distanced from the laser output section 50. By providing two cooling fluid flow paths in the laser oscillator 42e, the cooling performance is improved.

Figure 17:
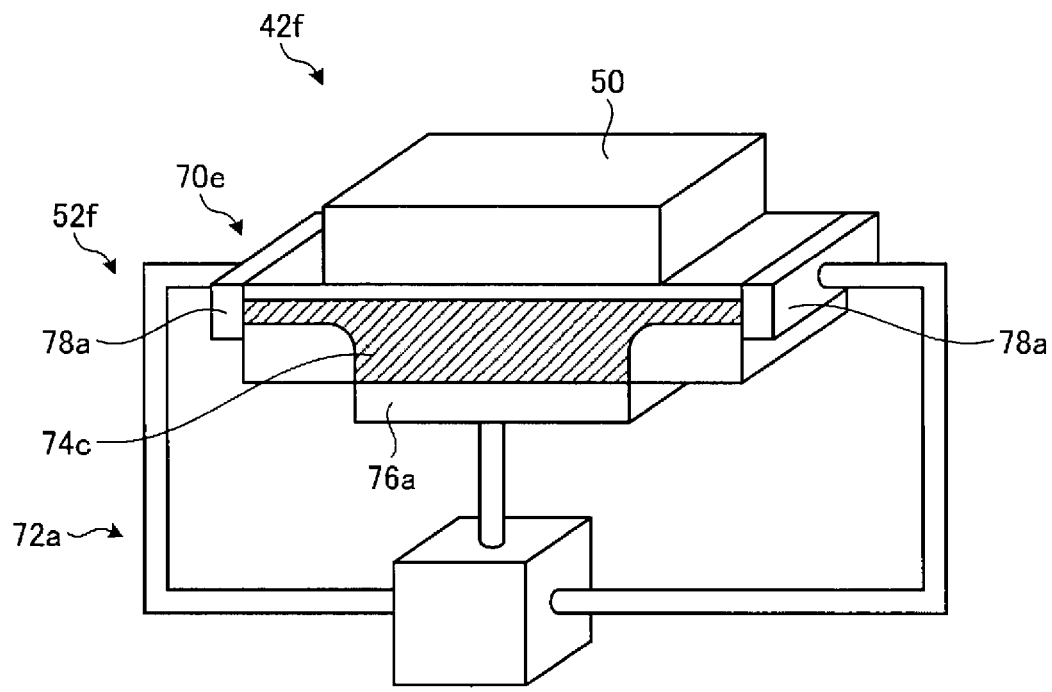
FIG. 17 is a perspective view illustrating a schematic configuration of a sixth variation on the cooling mechanism in the laser oscillator.

FIG. 17 is a perspective view illustrating a schematic configuration of a sixth variation on the cooling mechanism in the laser oscillator. According to a cooling mechanism 52f of a laser oscillator 42f illustrated in FIG. 17, a copper plate 70e and a cooling fluid supply mechanism 72a are provided. A cooling fluid flow path 74c and headers 76a and 78a are formed in the copper plate 70e. According to the cooling fluid flow path 74c, a cooling fluid inflow port is formed in a surface on the opposite side from the surface that makes contact with the laser output section 50, and cooling fluid outflow ports are formed in two opposing surfaces, of the four surfaces, that are orthogonal to the surface that makes contact with the laser output section 50. The header 76a connects to the inflow port formed in the surface on the opposite side from the surface that makes contact with the laser output section 50. The two headers 78a connect to the corresponding outflow ports formed in the two surfaces that are orthogonal to the surface that makes contact with the laser output section 50. The cooling fluid supply mechanism 72a cools the copper plate 70e by supplying cooling fluid to the cooling fluid flow path 74c from the header 76a and collecting cooling fluid discharged to the two headers 78a. Providing the cooling fluid inflow port on the opposite side of the copper plate 70e from the surface that makes contact with the laser output section 50 in this manner can supply the cooling fluid toward the laser output section 50. This can further improve the cooling capability.

Figure 18:
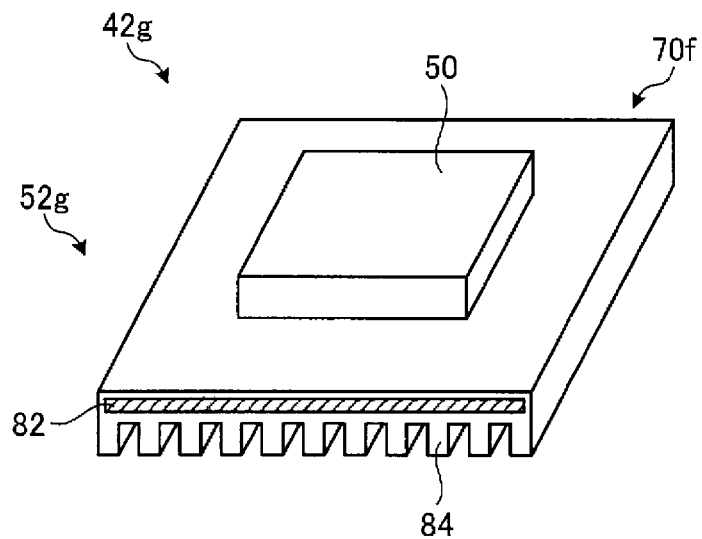
FIG. 18 is a perspective view illustrating a schematic configuration of a seventh variation on the cooling mechanism in the laser oscillator.

FIG. 18 is a perspective view illustrating a schematic configuration of a seventh variation on the cooling mechanism in the laser oscillator. According to a cooling mechanism 52g of a laser oscillator 42g illustrated in FIG. 18, both a cooling fluid flow path 82 and a heat sink 84 are formed in a copper plate 70f. In other words, in the cooling mechanism 52g, the copper plate 70f, which includes the structures of both the cooling fluid flow path 82 and the heat sink 84, is provided for the laser output section 50. This can improve the cooling performance with less number of components.

Additionally, the above-described variations can be combined in various ways. For example, a cooling mechanism that does not include a heat sink may be provided with a heat sink, and the cooling mechanism may have a larger shape than the laser output section 50 or the same shape as the laser output section 50.

The processing device is not limited to the above-described embodiment, and various other embodiments can be carried out. Other embodiments will be described hereinafter using FIGS. 19 to 24.

Second Embodiment

Figure 19:
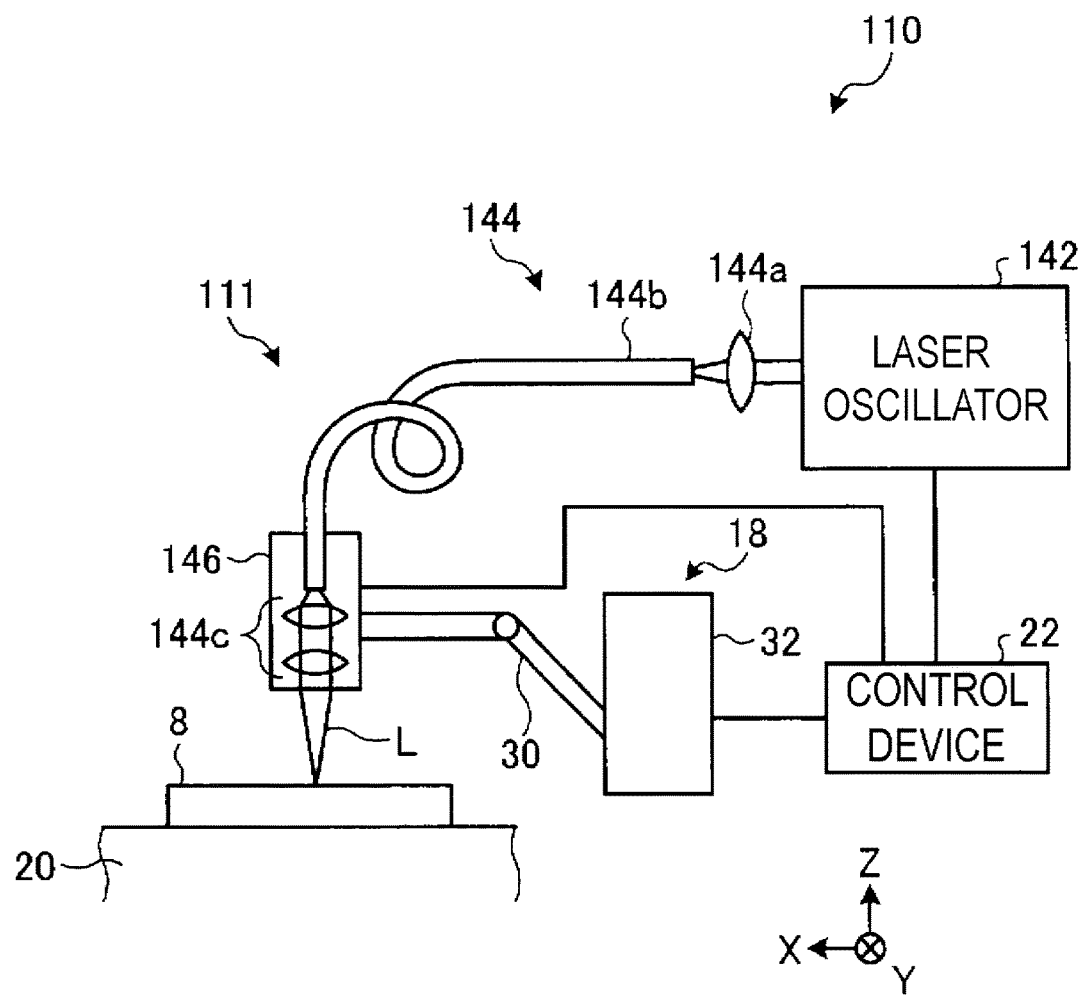
FIG. 19 is a schematic view illustrating a schematic configuration of a second embodiment of the processing device.

FIG. 19 is a schematic view illustrating a schematic configuration of a second embodiment of the processing device. Note that aside from the structure of the processing head, the processing device according to the second embodiment has the same configuration as the processing device 10 according to the first embodiment. Constituent elements that are the same as those of the processing device 10 will not be described.

A processing head 111 of a processing device 110 includes a laser oscillator 142, a guidance optical system 144, and a housing 146. The laser oscillator 142 and part of the guidance optical system 144 of the processing head 111 are disposed outside the housing 146. The laser oscillator 142 has the same structure as the laser oscillator 42, aside from the location where the laser oscillator 142 is disposed.

The guidance optical system 144 includes an incident-side focusing unit 144a, an optical fiber cable 144b, and an irradiation-side focusing unit 144c. The incident-side focusing unit 144a focuses the laser outputted from the laser oscillator 142 and causes the laser to be incident on the optical fiber cable 144b. The optical fiber cable 144b is a flexible transmitter. The optical fiber cable 144b emits the incident laser toward the irradiation-side focusing unit 144c. The irradiation-side focusing unit 144c focuses the laser outputted from the optical fiber cable 144b and irradiates the member to be processed 8 with the focused laser. The irradiation-side focusing unit 144c includes a collimating lens and a focusing lens, and collimates and then focuses the laser outputted from the optical fiber cable 144b. The housing 146 is supported on the arm 30, and supports part of the optical fiber cable 144b and the irradiation-side focusing unit 144c.

The laser outputted from the laser oscillator 142 may be transmitted using the optical fiber cable 144b as in the processing device 110. Outputting the laser using the VCSEL chips 56 can output a laser having a low angle of divergence, or in other words, that is highly directional, which can result in causing the laser to be incident on the optical fiber cable 144b in an efficient manner. This can make the optical fiber cable 144b thinner, which can result in further increasing the quality and the degree of focus of the laser with which the member to be processed 8 is irradiated. This can increase the precision of the processing.

Although the laser oscillator 142 is separate from the housing 146 in the processing device 110, the laser oscillator 142 may instead be disposed inside the housing 146 and the laser may be transmitted using the optical fiber cable 144b. In this case as well, using the optical fiber cable 144b can dispose the laser oscillator 142 in any desired position in the housing 146, which can increase the freedom of design.

Third Embodiment

Figure 20:
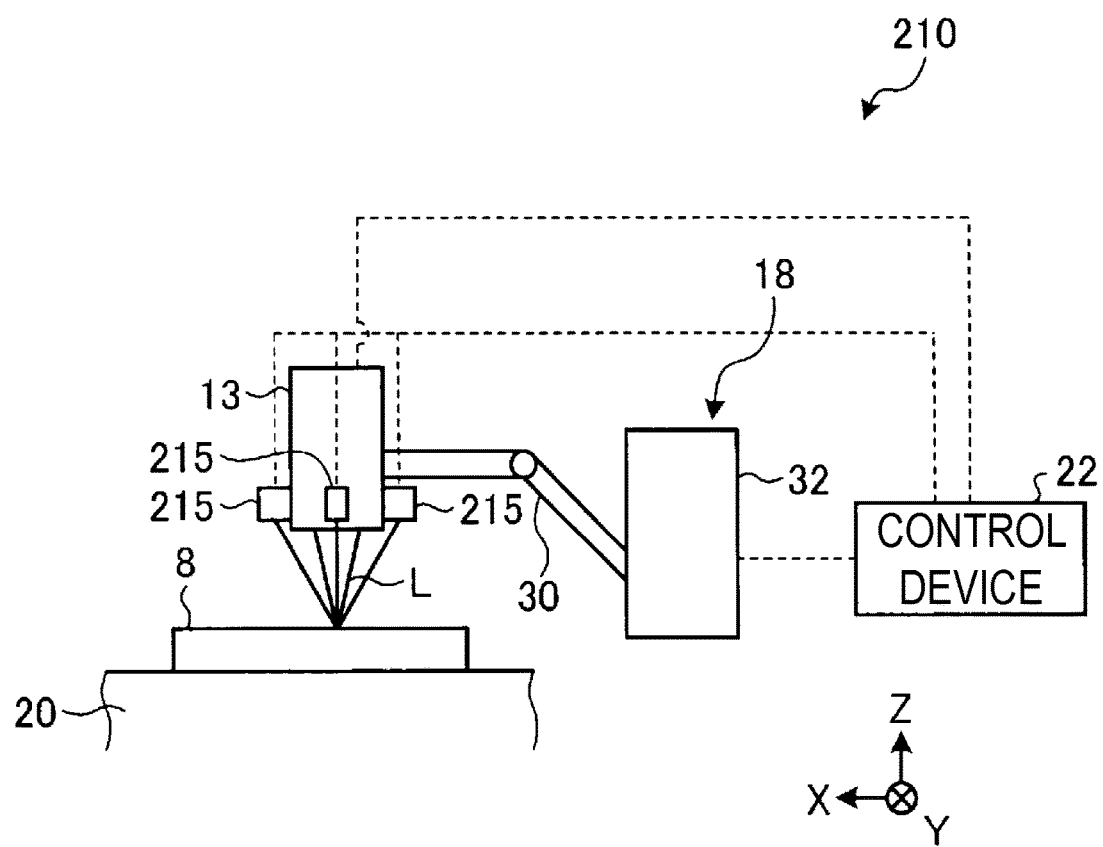
FIG. 20 is a schematic view illustrating a schematic configuration of a third embodiment of the processing device.

FIG. 20 is a schematic view illustrating a schematic configuration of a third embodiment of the processing device. Note that aside from heating heads being provided, the processing device according to the third embodiment has the same configuration as the processing device 10 according to the first embodiment. Constituent elements that are the same as those of the processing device 10 will not be described.

As illustrated in FIG. 20, a processing device 210 includes the processing head 13, the movement mechanism 18, the support 20, the control device 22, and a plurality of heating heads 215. Like the processing head 13, the heating heads 215 include VCSEL chips, and heat the member to be processed 8 by irradiating the member to be processed 8 with lasers outputted from the VCSEL chips. The heating heads 215 have the same structure as the processing head 13 and thus will not be described. The heating heads 215 are disposed in the periphery of the housing of the processing head 13, and are fixed to the processing head 13. The heating heads 215 thus move together with the processing head 13. The heating heads 215 are disposed in four locations in the periphery of the processing head 13, at equal angular intervals around an axis of the processing head 13.

The processing device 210 includes the heating heads 215 and heats a region to be processed or a region that has been processed by the processing head 13, which can carry out the processing at a higher level of precision. Additionally, the processing device 210 uses VCSEL chips as laser sources of the heating heads 215 and heats the member to be processed 8 by irradiating the member to be processed 8 with lasers outputted from the VCSEL chips. This can reduce the size of the part including the laser oscillators of the heating heads 215, which can result in integrating the heating heads 215 with processing head 13 with ease. Integrating the heating heads 215 with the processing head 13 makes it easy to achieve alignment, which makes it easy to carry out positional control. Additionally, by using VCSEL chips as laser sources of the heating heads 215 and heating the member to be processed 8 by irradiating the member to be processed 8 with lasers outputted from the VCSEL chips, the lasers outputted from the VCSEL chips can be controlled individually. As a result, the emitted lasers can be controlled with a high level of precision, which can carry out the heating with a higher level of precision. For example, it is possible to use a flat-top-shaped laser power distribution in order to heat uniformly, or increase the intensity only in some locations in order to heat locally. Additionally, by disposing the VCSEL chips in a matrix, controlling the outputs of the lasers through pulse oscillation, and driving the lasers in order by rows and by columns, the emitted lasers can be caused to scan.

Although the heating is preferably carried out more uniformly by providing the heating heads 215 at equal intervals as in the present embodiment, the invention is not limited thereto. A single heating head 215 may be provided for the processing head 13, or the heating heads 215 may be disposed in a non-uniform manner.

Additionally, in the case where VCSEL chips are used for the heating heads 215, the output of a single VCSEL chip is preferably no less than 10 W and no greater than 10 kW. Furthermore, the output of the laser oscillator is preferably no less than 50 W and no greater than 10 kW. The heating heads 215 can carry out the heating in a suitable manner by employing the above-described ranges.

Fourth Embodiment

Figure 21:
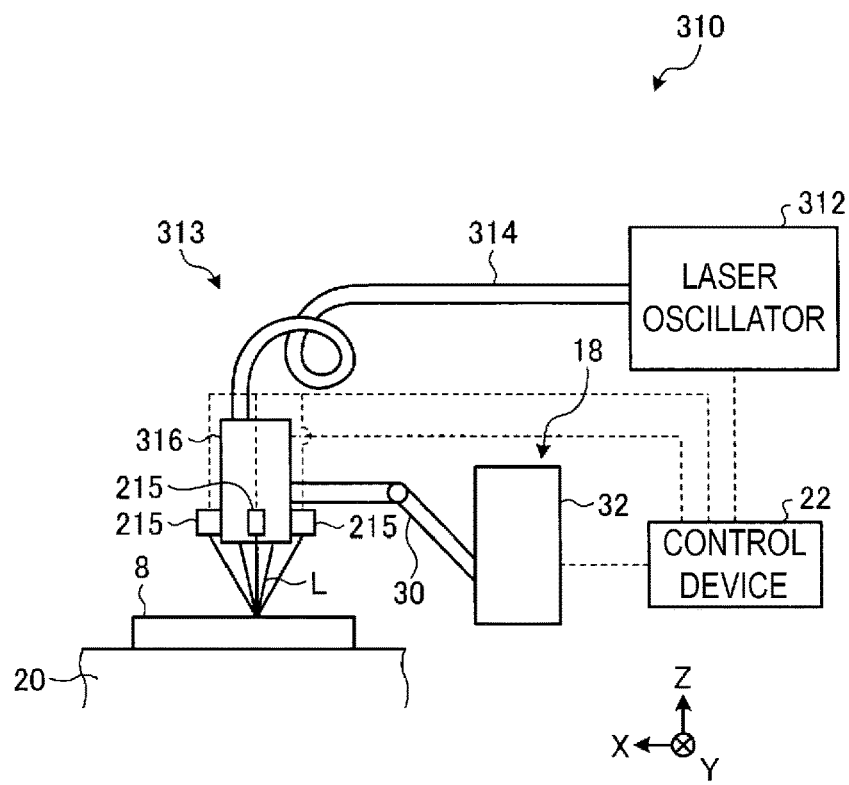
FIG. 21 is a schematic view illustrating a schematic configuration of a fourth embodiment of the processing device.

FIG. 21 is a schematic view illustrating a schematic configuration of a fourth embodiment of the processing device. Note that aside from the structure of the processing head, the processing device according to the fourth embodiment has the same configuration as the processing device 210 according to the third embodiment. Constituent elements that are the same as those of the processing device 210 will not be described.

As illustrated in FIG. 21, a processing device 310 includes a processing head 313, the movement mechanism 18, the support 20, the control device 22, and the plurality of heating heads 215. The processing head 313 includes a laser oscillator 312, an optical fiber cable 314, and an irradiating head 316.

The laser oscillator 312 is a device that outputs a laser. A fiber laser oscillator that outputs a laser using an optical fiber cable as a medium, a short-pulse laser oscillator that outputs a short-pulse laser, or the like can be used as the laser oscillator 312. A Fabry-Perot type fiber laser oscillator and a ring-type fiber laser oscillator can be given as examples of fiber laser oscillators. Additionally, the fiber laser oscillator may be a laser oscillator employing either a continuous waveform operation system or a pulsed operation system. Silica glass to which a rare-earth element (Er, Nd, Yb) has been added, for example, can be used for the fiber of the fiber laser oscillator. Meanwhile, a short pulse is a pulse having a pulsewidth of no greater than 100 picoseconds. A Ti-sapphire laser, for example, can be used as the laser generation source in the short-pulse laser oscillator.

The optical fiber cable 314 is an optical system that guides the laser outputted from the laser oscillator 312 to the irradiating head 316. One end of the optical fiber cable 314 is connected to a laser emitting port of the laser oscillator 312, and another end of the optical fiber cable 314 is connected to the irradiating head 316. The optical fiber cable 314 outputs the laser L, which has been outputted from the laser oscillator 312, toward an incident end of the irradiating head 316. Note that the optical system that guides the laser is not limited to an optical fiber cable. The processing device 310 may use a combination of mirrors, lenses, and the like as the optical system that guides the laser, and may guide the laser to the irradiating head 316 by reflecting and focusing the laser.

The irradiating head 316 is supported on the arm 30, and a focusing optical system is provided inside the irradiating head 316. The irradiating head 316 focuses the laser L outputted from the optical fiber cable 314 so as to irradiate the member to be processed 8.

In this manner, the processing device 310 uses light-emitting elements aside from VCSEL chips in the processing head 313. By providing VCSEL chips in heating heads and carrying out heating with the lasers outputted from the VCSEL chips even in the case where VCSEL chips are not used in the processing head 313, the heating can be controlled with a high level of precision while reducing the size of the heating head in the same manner as in the third embodiment, which can improve the precision of the processing. Meanwhile, although a processing head that carries out processing through laser irradiation is used in the fourth embodiment, the processing head may be a mechanism that carries out processing through machining.

Fifth Embodiment

Figure 22:
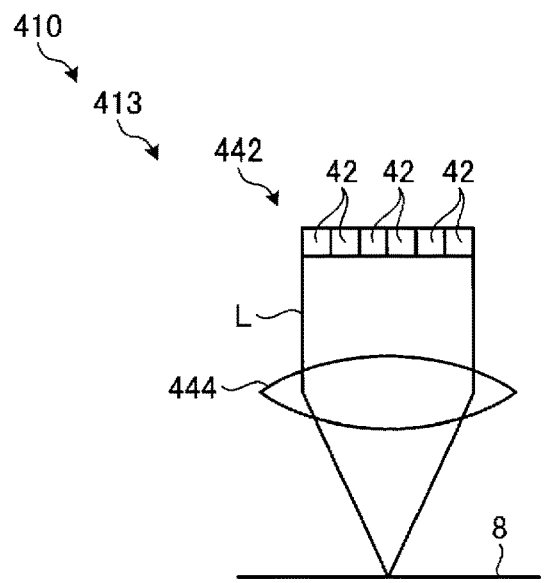
FIG. 22 is a schematic view illustrating a schematic configuration of a fifth embodiment of the processing device.
Figure 23:
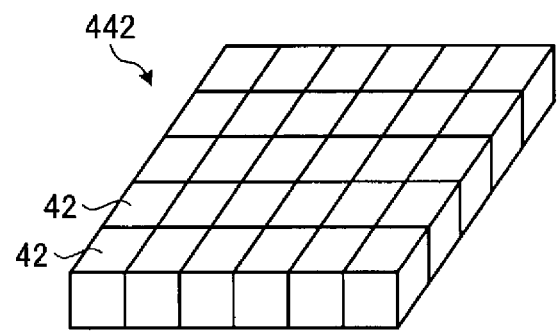
FIG. 23 is a schematic view illustrating an arrangement of laser oscillators.

FIG. 22 is a schematic view illustrating a schematic configuration of a fifth embodiment of the processing device. FIG. 23 is a schematic view illustrating the arrangement of laser oscillators. Note that aside from a processing head 413 including a plurality of laser oscillators 42, the processing device according to the fifth embodiment has the same configuration as the processing device 10 according to the first embodiment. Constituent elements that are the same as those of the processing device 10 will not be described.

As illustrated in FIG. 22, the processing head 413 of a processing device 410 includes a laser output unit 442 and a guidance optical system 444. As illustrated in FIGS. 22 and 23, in the laser output unit 442, the plurality of laser oscillators 42 are arranged in matrix form such that laser output surfaces of the laser oscillators 42 form a single plane. The guidance optical system 444 focuses the laser L outputted from the plurality of laser oscillators 42 onto the member to be processed 8.

The processing device 410 can realize a higher laser output by irradiating the member to be processed 8 with the laser L outputted from the plurality of laser oscillators 42. The processing can be carried out at a higher output as a result. Additionally, a single laser oscillator 42 is smaller than a fiber-optic laser or the like, and thus the laser oscillators 42 can be disposed adjacent to each other on a flat plane with ease.

Note that any number of laser oscillators 42 can be used in the laser output unit 442. Additionally, in the laser output unit 442 according to the present embodiment, the laser oscillators 42 are arranged in matrix form so as to form a quadrangular laser output surface in which the laser oscillators 42 are connected. However, a variety of shapes, such as a circle, an oval, or a polygon, can be used instead.

Sixth Embodiment

Figure 24:
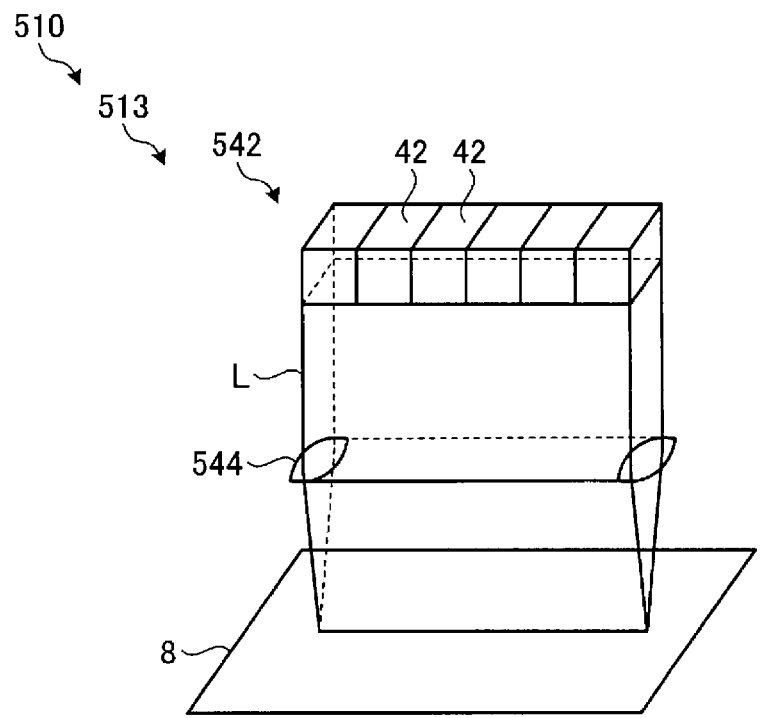
FIG. 24 is a schematic view illustrating a schematic configuration of a sixth embodiment of the processing device.

FIG. 24 is a schematic view illustrating a schematic configuration of a sixth embodiment of the processing device. Note that aside from the processing head 13 including a plurality of laser oscillators 42, the processing device according to the sixth embodiment has the same configuration as the processing device 10 according to the first embodiment. Constituent elements that are the same as those of the processing device 10 will not be described.

As illustrated in FIG. 24, a processing head 513 of a processing device 510 includes a laser output unit 542 and a guidance optical system 544. As illustrated in FIG. 24, in the laser output unit 542, the plurality of laser oscillators 42 are arranged in a single row such that laser output surfaces of the laser oscillators 42 form a single plane. The guidance optical system 544 is a cylindrical lens extending in the direction in which the plurality of laser oscillators 42 are arranged, and focuses the laser L outputted from the plurality of laser oscillators 42 onto the member to be processed 8.

As illustrated in FIG. 24, according to the processing device 510, arranging the laser oscillators 42 of the laser output unit 542 in a single row can emit the laser in a line shape. Additionally, controlling the outputs of the VCSEL chips 56 of the laser oscillators 42 can obtain a line-shaped laser having a uniform laser intensity. Thus, line-shaped processing can be carried out suitably.

Figure 25:
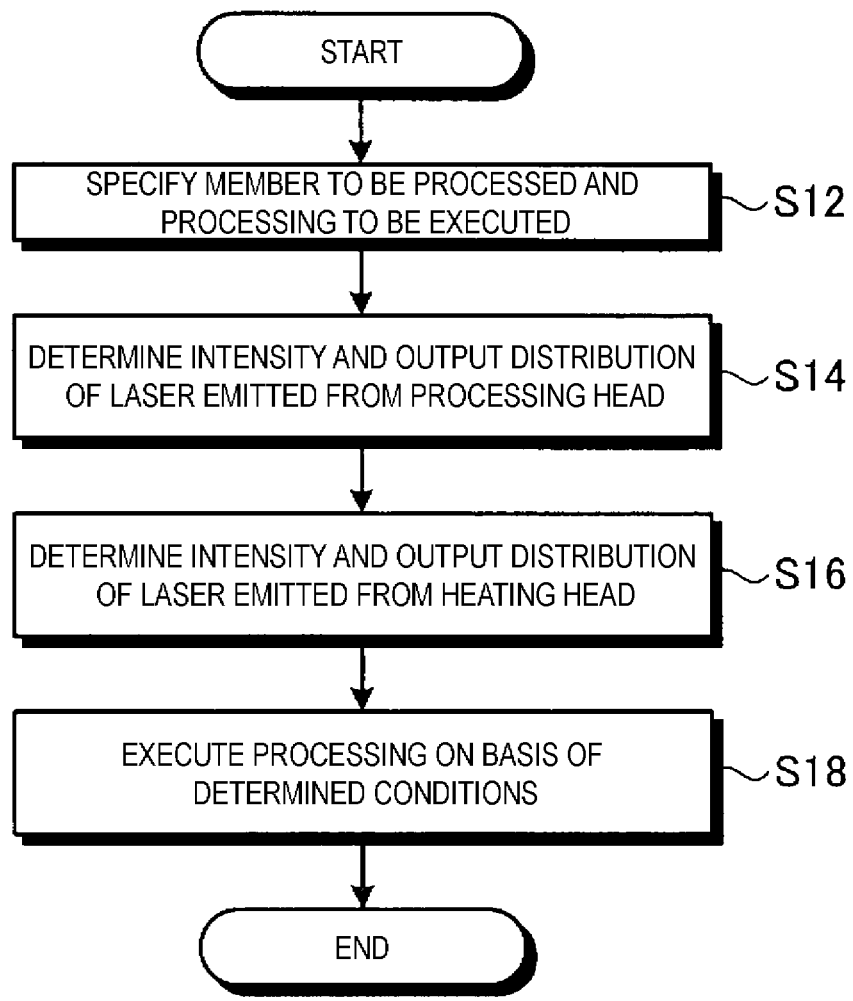
FIG. 25 is a flowchart illustrating an example of processing operations performed by the processing device.

Next, processing operations performed by the processing device will be described using FIG. 25. FIG. 25 is a flowchart illustrating an example of processing operations performed by the processing device. Note that FIG. 25 describes a case where processing is carried out while also carrying out heating. In the case where heating is not carried out, only the steps related to processing need be executed.

The control device 22 specifies the member to be processed and the processing to be carried out on the member to be processed (step S12). The control device 22 specifies the material of the member to be processed, whether the processing to be carried out is three-dimensional printing, cladding, welding, surface treatment, boring holes, cutting, or engraving, a processing amount, and so on.

After specifying the member to be processed and the processing to be carried out, the control device 22 determines the intensity and laser power distribution of the laser to be emitted from the processing head (step S14), and determines the intensity and laser power distribution of the laser to be emitted from the heating head (step S16). The control device 22 may execute the processes of step S14 and step S16 in parallel, or may execute these processes in the reverse order. After determining the driving conditions of the processing head and the heating head, the control device 22 carries out the processing on the basis of the determined conditions (step S18).

Such a processing device includes the laser oscillator having a plurality of VCSEL chips, and can therefore easily adjust the intensity and laser power distribution of the lasers emitted from the processing head and the heating head. Thus, processing can be carried out at a higher level of precision.

For example, in the case where the processing is three-dimensional printing, cladding, or welding, higher-quality processing can be carried out by carrying out heating using the laser emitted from the heating head that has the VCSEL chips. For example, using the heating head to appropriately control a temperature throughout the process of melting and hardening a material can control a cooling rate from a melted state to a hardened state with a high level of precision, which can result in increasing the quality of the processing. Additionally, carrying out the above-described processing using the processing head that has the VCSEL chips can set the laser power distribution of the emitted lasers to a preferable distribution, which can further increase the quality of the processing.

Additionally, in the case where the processing is surface treatment (quench hardening, heating, polishing, surface cleaning, or the like), higher-quality processing can be carried out by carrying out heating using the laser emitted from the heating head that has the VCSEL chips. For example, using the heating head to appropriately control a temperature in the periphery of an area being processed by the processing head can control a cooling rate with a high level of precision, which can result in further increasing the quality of the processing. Additionally, carrying out the above-described processing using the processing head that has the VCSEL chips can set the laser power distribution of the emitted lasers to a preferable distribution, which can further increase the quality of the processing.

Additionally, in the case where the processing is boring holes in or cutting a brittle material or a material including a brittle material along with a laminated material, higher-quality processing can be carried out by carrying out heating using the laser emitted from the heating head that has the VCSEL chips. For example, using the heating head to appropriately control a temperature in the periphery of an area being processed by the processing head can alleviate thermal shock, which suppresses cracking in the brittle material or peeling between laminated materials caused by thermal shock in the processing carried out by the processing head, and particularly in laser processing. This can further increase the quality of the processing. Additionally, carrying out the above-described processing using the processing head that has the VCSEL chips can set the laser power distribution of the emitted lasers to a preferable distribution, which can further increase the quality of the processing.

Additionally, according to the processing head 13, a location of the member to be processed 8 that is irradiated may be rotated by rotating an optical path of the laser L around an axis of rotation. Processing such as cutting by moving the location irradiated by the laser L can be carried out by the processing head 13 suitably so as to trace a circle.

REFERENCE SIGNS LIST

8 Member to be processed
10 Processing device

13 Processing head
18 Movement mechanism
20 Support
22 Control device
30 Arm
32 Driving source
42 Laser output device
44 Guidance optical system
46 Housing
50 Laser output section
52 Cooling mechanism
54 Substrate
56 VCSEL chip
57a, 57b Wire
58 Current control circuit
59a, 59b, 59c, 59d Wire
70 Copper plate
72 Cooling fluid supply mechanism
74 Cooling fluid flow path
76, 78 Header
80 Heat sink

The invention claimed is:

1. A processing device that processes a member to be processed by irradiating the member to be processed with a laser, the device comprising:
   a laser oscillator including a plurality of vertical cavity surface-emitting laser elements that output a laser having a wavelength of no greater than 1,070 nm, and a substrate on the surface of which the plurality of vertical cavity surface-emitting laser diode chips are arranged in a matrix;
   a guidance optical system that guides the laser outputted from the laser oscillator; and
   a control device that controls the output of the laser oscillator.

2. The processing device according to claim 1, comprising a plurality of the laser oscillators,
   wherein the plurality of laser oscillators are arranged so that laser output surfaces thereof are adjacent to each other.

3. The processing device according to claim 2, wherein the plurality of laser oscillators are arranged in a matrix.

4. The processing device according to claim 2, wherein the plurality of laser oscillators are arranged in a single row.

5. A processing device that processes a member to be processed, the device comprising:
   a processing head that processes the member to be processed;
   a heating head that heats the member to be processed, the heating head including a laser oscillator, which has a plurality of vertical cavity surface-emitting laser diode chips that output a laser and a substrate on the surface of which the plurality of vertical cavity surface-emitting laser diode chips are arranged in a matrix, and a guidance optical system that guides the laser outputted from the laser oscillator; and
   a control device that controls the heating of the member to be processed by controlling the output of the laser oscillator.

6. The processing device according to claim 5, wherein the processing head processes the member to be processed by irradiating the member to be processed with a laser.

7. The processing device according to claim 5, wherein the heating head is fixed to the processing head.

8. The processing device according to claim 1, wherein the guidance optical system focuses the laser outputted from the plurality of vertical cavity surface-emitting laser diode chips onto the member to be processed.

9. The processing device according to claim 1, wherein the guidance optical system includes a focusing unit that focuses the laser outputted from the plurality of vertical cavity surface-emitting laser diode chips, and an optical fiber cable on which the laser focused by the focusing unit is incident and that transmits the laser.

10. The processing device according to claim 1, wherein the laser oscillator includes a cooling mechanism that cools the substrate.

11. The processing device according to claim 1, wherein the control device controls a laser power distribution of the vertical cavity surface-emitting laser diode chips of the laser oscillator.

12. The processing device according to claim 1, wherein the processing is one of three-dimensional printing, cladding, welding, surface treatment, boring a hole, cutting, and engraving.

13. A processing method for processing a member to be processed by irradiating the member to be processed with a laser, the method comprising:
    outputting a laser having a wavelength of no greater than 1,070 nm from a plurality of vertical cavity surface-emitting laser diode chips arranged in a matrix on a surface; and
    processing the member to be processed by guiding the outputted laser using a guidance optical system.

14. A processing method for processing a member to be processed by irradiating the member to be processed with a laser, the method comprising:
    heating the member to be processed by outputting a laser from a plurality of vertical cavity surface-emitting laser diode chips arranged in a matrix on a surface and guiding the outputted laser using a guidance optical system; and
    processing the member to be processed using a processing head.

15. The processing device according to claim 6, wherein the heating head is fixed to the processing head.

16. The processing device according to claim 2, wherein the guidance optical system focuses the laser outputted from the plurality of vertical cavity surface-emitting laser diode chips onto the member to be processed.

17. The processing device according to claim 3, wherein the guidance optical system focuses the laser outputted from the plurality of vertical cavity surface-emitting laser diode chips onto the member to be processed.

18. The processing device according to claim 4, wherein the guidance optical system focuses the laser outputted from the plurality of vertical cavity surface-emitting laser diode chips onto the member to be processed.

19. The processing device according to claim 5, wherein the guidance optical system focuses the laser outputted from the plurality of vertical cavity surface-emitting laser diode chips onto the member to be processed.

20. The processing device according to claim 6, wherein the guidance optical system focuses the laser outputted from the plurality of vertical cavity surface-emitting laser diode chips onto the member to be processed.

* * * * *